United States Patent
Burnside et al.

(10) Patent No.: US 6,437,748 B1
(45) Date of Patent: Aug. 20, 2002

(54) TAPERED ANECHOIC CHAMBER

(75) Inventors: Walter D. Burnside; Eric K. Walton; Stephen Essman; Wilhelmus Theunissen, all of Columbus, OH (US)

(73) Assignee: The Ohio State University, Columbus, OH (US)

( * ) Notice: Subject to any disclaimer, the term of this patent is extended or adjusted under 35 U.S.C. 154(b) by 0 days.

(21) Appl. No.: 09/619,782

(22) Filed: Jul. 20, 2000

(51) Int. Cl.[7] .................................... G01R 29/08
(52) U.S. Cl. ................... 343/703; 342/1; 324/627
(58) Field of Search .................... 343/703, 786; 342/1, 165; 324/627, 628

(56) References Cited

U.S. PATENT DOCUMENTS

| | | | |
|---|---|---|---|
| 3,308,463 A | | 3/1967 | Emerson ............... 343/18 |
| 5,039,949 A | * | 8/1991 | Hemming et al. ...... 324/646 |
| 5,337,016 A | * | 8/1994 | Wozniak et al. ....... 324/632 |
| 5,757,194 A | * | 5/1998 | Yun .................. 324/627 |

OTHER PUBLICATIONS

W.D. Burnside, L–C.T. Chang, M. Gilreath, and B. Smith, "An Ultrawide Bandwidth Tapered Chamber Feed," 1996 ATMA Symposium, Seattle, WA, Oct. 1996.

A.K.Y.Lai, A.R. Sinpoli, and W.D. Burnside, "A Novel Antenna for Ultra–wide–band Applications," *IEEE Trans. Antennas Propagat.*, vol. 40, No. 7, Jul. 1992.

J.R.J.Gau, W.D. Burnside, and M.C. Gilreath, "Chebyshev Multilevel Absorber Design Concept," *IEEE Trans. Antennas Propagat.*, vol. 45, No. 8, Aug. 1997.

\* cited by examiner

*Primary Examiner*—Don Wong
*Assistant Examiner*—James Clinger
(74) *Attorney, Agent, or Firm*—Standley & Gilcrest LLP

(57) ABSTRACT

The present invention includes tapered anechoic chambers and chamber systems. This invention also includes machines or electronic apparatus using these aspects of the invention. The present invention also includes methods and processes for using these devices and systems. In a preferred embodiment, a TEM antenna is utilized that is terminated by a resistive card, or R-card. This makes for a very broadband antenna that may be used to properly illuminate the test zone in a tapered chamber without changing the feed antenna. A preferred chamber utilizes an absorber layout that has never been applied to a tapered chamber, called a Chebyshev absorber layout. The concept is to place the wedge absorber tips at different heights relative to the mounting side wall and pyramidal absorber tips at different heights relative to the back wall. In this pattern, wave reflections off the pyramid tips and valleys behave very much like reflections in a multi-section transmission line. Using this Chebyshev layout around the test zone, the test zone fields will be very clean of stray signals and the polarization will be dictated by the feed horn. Also, it is then not necessary to use very thick absorber for low frequency applications, which tend to deteriorate over time. A preferred chamber also comprises a design wherein an entire tip portion of the tapered section is a separate unit. This unit is preferably designed to rotate on a system of rollers positioned between the unit and the main chamber. The result is that the polarization of the chamber can be easily changed from vertical to horizontal by simply rotating the feed structure, which can be done without disconnecting any cables to the feed.

21 Claims, 5 Drawing Sheets

TAPERED ANECHOIC CHAMBER

TECHNICAL FIELD OF THE INVENTION

The present invention is in the field of anechoic chambers suitable for evaluating and measuring the characteristics and properties of antennas and other electronic devices.

BACKGROUND OF THE INVENTION

This invention relates to methods and apparatus useful in measurement and testing of antennas and other electronic devices. More specifically, this invention relates to an improved tapered anechoic chamber that significantly lowers scattering effects and allows for easy rotation of the feed antenna.

The tapered chamber concept was introduced many years ago. It was originally developed to reduce stray signals normally associated with traditional rectangular chambers by placing the feed antenna at the throat of a tapered section. The antenna must then radiate a field that does not illuminate the walls, as it would not satisfy the necessary electromagnetic boundary conditions.

Unfortunately, the basic chamber design has several problems. First, authors of the original concept did not actually have a broadband feed antenna that could satisfy the boundary conditions in this application. As a result, multiple feeds had to be used and moved around in the throat region to get the proper field quality in the test zone. The original tapered chamber also assumed that the sidewall absorber had to be smooth wedge absorber, as shown in FIG. 1, continuous from the feed area to the back wall of the chamber 1. In practice this has not been the case, as a test object 2 tends to scatter incident energy 3 toward 4 the walls, ceiling, and floor. This energy is then strongly scattered by wedge absorber 5 back to the test object 2.

To correct this situation, FIG. 2 shows that tapered chambers 7 today normally have pyramidal absorber 8 mounted on the walls, ceiling, and floor surrounding the test zone. These absorber layout schemes, however, similarly lead to undesired scattered signal effects. An improved absorber scheme is desired.

Tapered chambers are normally used for low frequency measurements, which requires the back wall pyramidal absorber to be quite thick using current absorber layout schemes. This leads to long chambers and absorber that deteriorates with time, as the pyramid tips tend to droop due to their size and weight.

Also, there exists a complex problem with the feed antenna. The phase center of the antenna is preferably at the vertex of the absorber-lined chamber. At first glance this might seem impossible, as the surrounding absorber would tend to attenuate the input energy from the feed. To avoid this situation, tapered chamber manufacturers today use log periodic or horn antennas displaced from the vertex of the tapered chamber. This in turn leads to some of the same problems observed in rectangular chambers. As the feed antenna illuminates the walls, undesired stray energy is scattered into the test zone.

Another issue with this chamber/feed antenna design involves changing the polarization of the feed antenna. Since the feed is inherently surrounded by specifically-designed absorber at the throat of the tapered section, rotating the feed antenna is not possible in a rigid chamber.

It is therefore an object of the present invention to develop a tapered anechoic chamber that minimizes undesired signal scattering, minimizes chamber length, and minimizes absorber deterioration, while at the same time allowing easy rotation of the feed antenna.

Although described with respect to the field of electromagnetic measurement, it will be appreciated that similar advantages may obtain in other applications of the present invention. Such advantages may become apparent to one of ordinary skill in the art in light of the present disclosure or through practice of the invention.

SUMMARY OF THE INVENTION

The present invention includes tapered anechoic chambers and chamber systems. This invention also includes machines or electronic apparatus using these aspects of the invention. The present invention may also be used to upgrade, repair or retrofit existing machines or electronic devices or instruments of these types, using methods and components used in the art. The present invention also includes methods and processes for using these devices.

A tapered anechoic chamber of the present invention first comprises a planar back wall having a rectangular shape. The chamber also has a planar front wall comprising a rectangular shape. The planar front wall is positioned parallel to and separated a distance from the back wall. The planar front wall is of smaller dimension than the planar back wall, the center points of the front and back walls lying along a line orthogonal to the planes defined by the walls.

The chamber has four side walls, each of which are connected to a full edge of the planar back wall. Each of the side walls lies in a plane that is orthogonal to the plane defined by the back wall. The four side walls are connected at the adjacent edges so as to form a rectangular enclosure attached to the planar back wall. The chamber also has four tapered side walls. Each of the tapered side walls contacts a full outer edge of one of the side walls and a full edge of the planar front wall. The tapered side walls are then connected at adjacent edges so as to form an enclosed range between the planar front and back walls.

Electromagnetic energy absorbing material is attached to the inside of the enclosed range. The material may be any electromagnetic energy absorbing material known in the art. The material comprises a plurality of tapered members, such as pyramidal or wedge members, extending into the enclosed range. At least one portion of the energy absorbing material comprises a plurality of tapered members wherein adjacent tapered members comprise different lengths from the tip to the base of each member. The tips of the tapered members preferably form a periodic pattern, such as a sinusoidal pattern, semi-sinusoidal pattern, or Chebyshev pattern. The portion of the chamber which has the adjacent tapered members of differing length may be any appropriate portion of the chamber, such as the front wall, back wall, side walls, or tapered side walls.

The chamber may additionally comprise a feed antenna positioned near the front wall in the enclosed range. The chamber may also have a probe antenna positioned between the four side walls of the enclosed range. These antennas may be any appropriate antennas known in the art.

Also included in the present invention is a second tapered anechoic chamber that comprises planar front and back walls, each having a rectangular shape. The front wall is positioned parallel to, and separated a distance from the back wall, and is of a smaller dimension than the back wall. The center points of the front and back walls lie along a line orthogonal to the planes defined by the walls.

The chamber comprises four side walls, each of the-side walls connected to a full edge of the planar back wall. Each side wall lies in a plane orthogonal to the plane defined by the planar back wall. The four side walls are connected so as to form a rectangular enclosure attached to the back wall. The chamber also has four tapered side walls, each of the tapered side walls contacting a full outer edge of one of the side walls and a full edge of the planar front wall. The four tapered side walls are connected so as to form an enclosed range between the front and back walls.

The chamber has an electromagnetic energy absorbing material attached to the inside of the enclosed range. This may be any appropriate material known in the art. A TEM antenna extends into the enclosed range from the planar front wall. A resistive card then terminates the TEM antenna in the enclosed range. The resistive card may be any appropriate card with an appropriate resistivity. The chamber may additionally comprise a probe antenna positioned between the four side walls in the enclosed range.

The present invention also includes another tapered anechoic chamber. This chamber comprises planar front and back walls, each wall having a rectangular shape. The planar front wall is positioned parallel to and separated a distance from the back wall, the front wall having a dimension smaller than the back wall. The center points of the front and back walls lie along a line orthogonal to the planes defined by these walls.

The chamber comprises four side walls, each of which is connected to a full edge of the planar back wall. Each side wall lies in a plane orthogonal to the plane defined by the planar back wall. The four side walls are connected at adjacent edges so as to form a rectangular enclosure attached to the planar back wall. The chamber also has four tapered planar rear side portions, each of which contacts a full outer edge of one of the side walls. Each of the tapered rear side portions lies in a plane defined by an outer edge of one of the side walls and an edge of the planar front wall. The tapered planar rear side portions are connected at adjacent edges so as to define an open-ended range.

The chamber also comprises four tapered planar front side portions, each of which contacts a full edge of the planar front wall. Each of the tapered front side portions lies in a plane defined by an outer edge of one of the side walls and an edge of the planar front wall. The tapered planar front side portions are connected so as to define an open-ended tip separated from the open-ended range.

Electromagnetic energy absorbing material is attached to the inside of the open-ended range and the open-ended tip. The material may be any appropriate electromagnetic energy absorbing material known in the art. A system of rollers is positioned between the open-ended range and the open-ended tip. The system of rollers is preferably adapted to allow rotation of the open-ended tip relative to the open-ended range. The range may additionally comprise a feed antenna positioned between the tapered planar front side portions or a probe antenna positioned between the four side walls.

The present invention contains another tapered anechoic chamber. This chamber comprises planar front and back walls, each having a rectangular shape. The front wall is separated a distance from the back wall, and comprises a smaller dimension. The center points of the walls lie along a line orthogonal to the planes defined by the walls.

The chamber has four side walls, each of which is connected to a full edge of the planar back wall. Each side wall lies in a plane orthogonal to the plane defined by the planar back wall. The four side walls are connected so as to form a rectangular enclosure attached to the planar back wall. The chamber also has four tapered planar rear side portions, each of which contacts a full outer edge of one of the side walls. Each of the tapered rear side portions lies in a plane defined by an outer edge of one of the side walls and an edge of the planar front wall. The tapered planar rear side portions are connected so as to define an open-ended range.

The chamber has four tapered planar front side portions, each of which contacts a full edge of the planar front wall. Each tapered front side portions lies in a plane defined by an outer edge of one of the side walls and an edge of the planar front wall. The tapered planar front side portions are connected so as to define an open-ended tip separated from the open-ended range.

Electromagnetic energy absorbing material is attached to the inside of the open ended range and the open ended tip. The material comprises a plurality of tapered members extending into the open ended range and the open ended tip. At least one portion of the electromagnetic energy-absorbing material comprises a plurality of tapered members wherein adjacent tapered members comprise different lengths from the tip to the base of each pyramidal member. The tips of the tapered members preferably form a periodic pattern, such as a sinusoidal pattern, semi-sinusoidal pattern, or Chebyshev pattern.

A system of rollers is positioned between the open-ended range and the open-ended tip, preferably adapted to allow rotation of the open-ended tip relative to the open ended range. A TEM antenna extends into the area of the open-ended tip from the planar front wall. A resistive card or R-card terminates the TEM antenna in the open ended tip. The chamber may also comprise a probe antenna positioned between the four side walls. The probe antenna may be adapted to rotate over a range. There may also be a measurement device in communication with the probe antenna.

DETAILED DESCRIPTION OF THE PREFERRED EMBODIMENTS(S)

In accordance with the foregoing summary, the following presents a detailed description of the preferred embodiment of the invention that is currently considered to be the best mode.

The present invention overcomes many of the problems with current anechoic chambers. A preferred embodiment of the present invention comprises a TEM antenna that is terminated by a resistive card, or R-card. This makes for a very broadband antenna, such as a range of 400 MHz to 6 GHz, which may be used to properly illuminate the test zone in a tapered chamber without changing the feed antenna. This is possible because the TEM structure confines the incident energy between the plates and away from the wall absorber. As the electromagnetic energy propagates onto the tapered R-card, the wave gradually senses the absorber and creates the desired spherical wave radiated field. This field has a very weak intensity at the angles that illuminate the wall absorber. There is some energy lost in the absorber, but not enough to impact the measurement. This appears to solve the basic feed problem associated with traditional tapered chambers.

Figure 5:
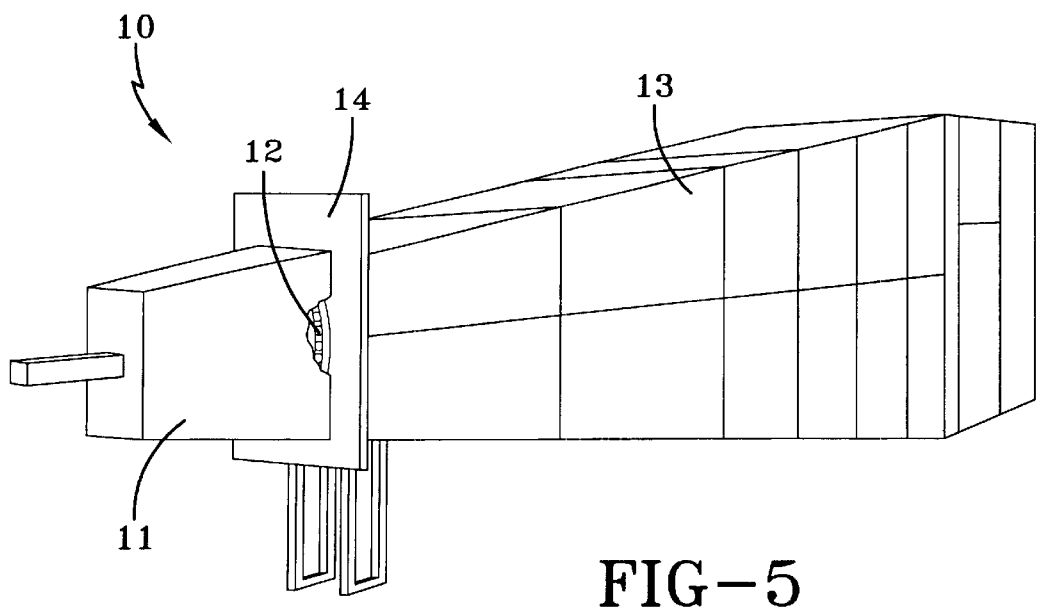
FIG. 5 is a pictorial view of an enhanced tapered chamber of the present invention.

In order to address the problem of changing the polarization of the feed antenna, a preferred embodiment of the present invention shown in FIG. 5 comprises a design wherein an entire tip portion of the tapered section of the range 10 is a separate unit 11. This unit 11 is then designed to rotate on a system of rollers 12 positioned between the unit 11 and the main chamber 13. A large flange 14 is mounted to the rest of the tapered chamber. This flange 14 may be covered with various rollers and bearings for the feed structure to roll on. The feed structure is preferably pyramid shaped, ending with a circular flange at the aperture that connects and rolls on the bearings. The result is that the polarization of the chamber can easily be changed from vertical to horizontal by simply rotating the feed structure, which can be done without disconnecting any cables to the feed.

Figure 1:
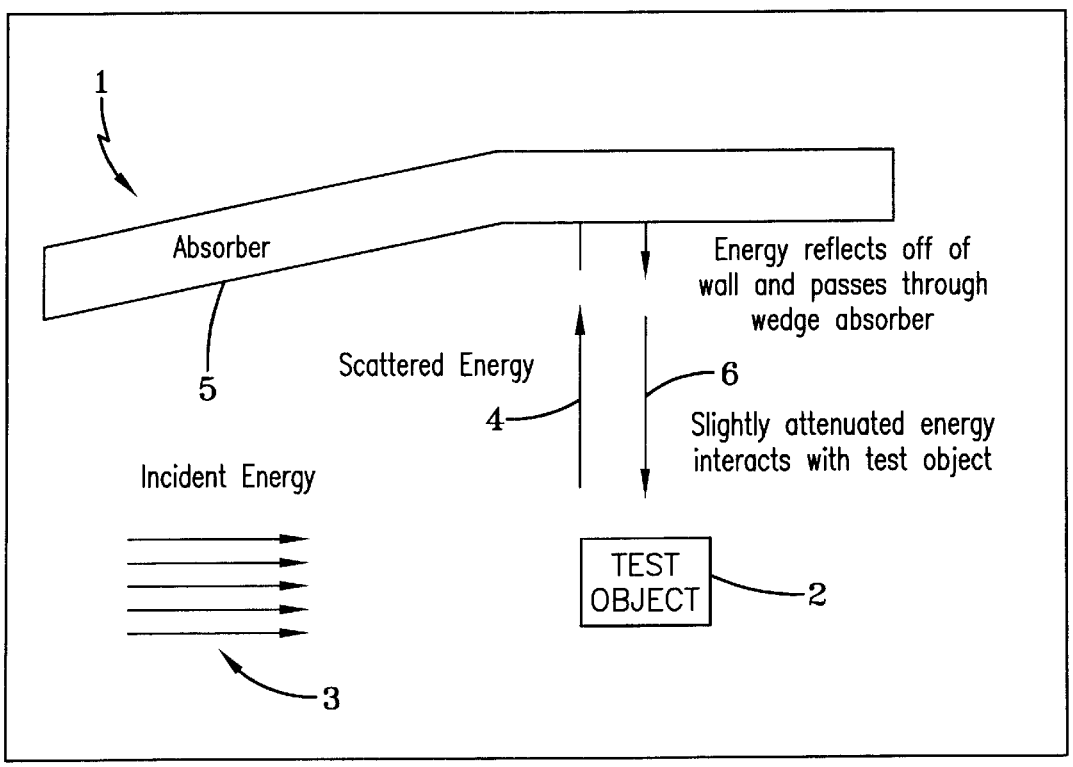
FIG. 1 is a side view of a tapered chamber in accordance with the present invention.

A preferred embodiment of the present invention also addresses problems associated with absorber treatment along the walls, ceiling, and floor surrounding the test zone. When wedge absorber alone is used, as shown in FIG. 1, the incident field illumination is very good, but the test object interacts strongly with the walls, floor, and ceiling. This is due to the fact that the wedge absorber simply is not the best choice of material shapes to attenuate the field scattered by the test object. The scattered energy is still strong enough to reflect off the wall and travel back to the test object. This is generally not acceptable.

Figure 2:
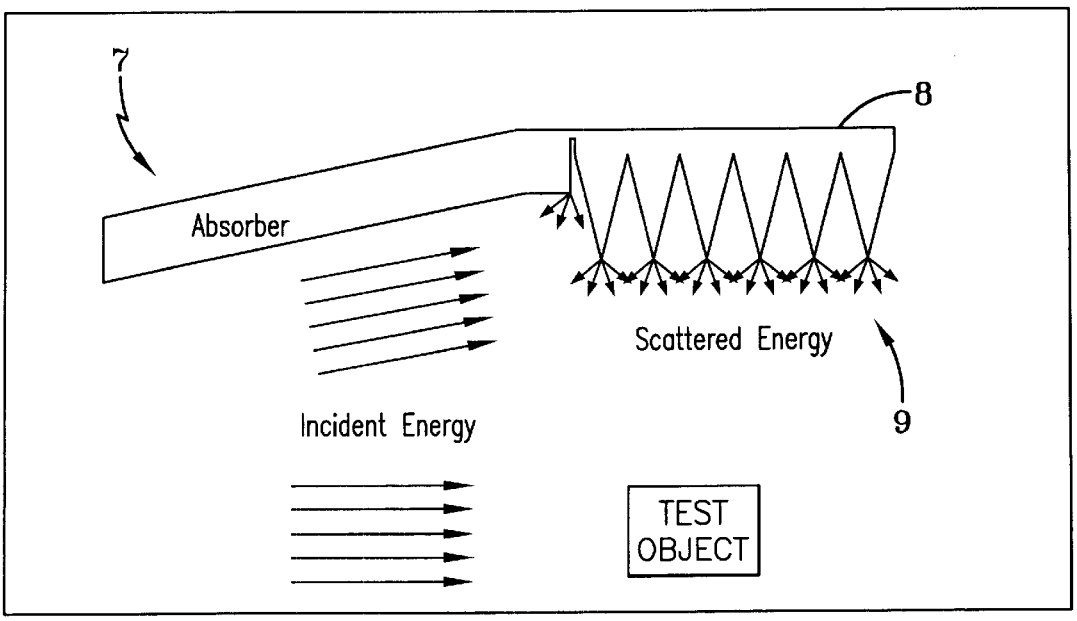
FIG. 2 is a side view of another tapered chamber in accordance with the present invention.

As mentioned previously, to correct this error term the walls, ceiling, and floor are normally covered with pyramidal absorber, as shown in FIG. 2. This pyramidal absorber, however, causes the incident field coming directly from the feed to scatter energy, as it forms strong discontinuities between the wedge and pyramidal absorber types. This in turn leads to new error terms, which impact both the co- and cross-polarization performance of the tapered chamber.

Figure 3:
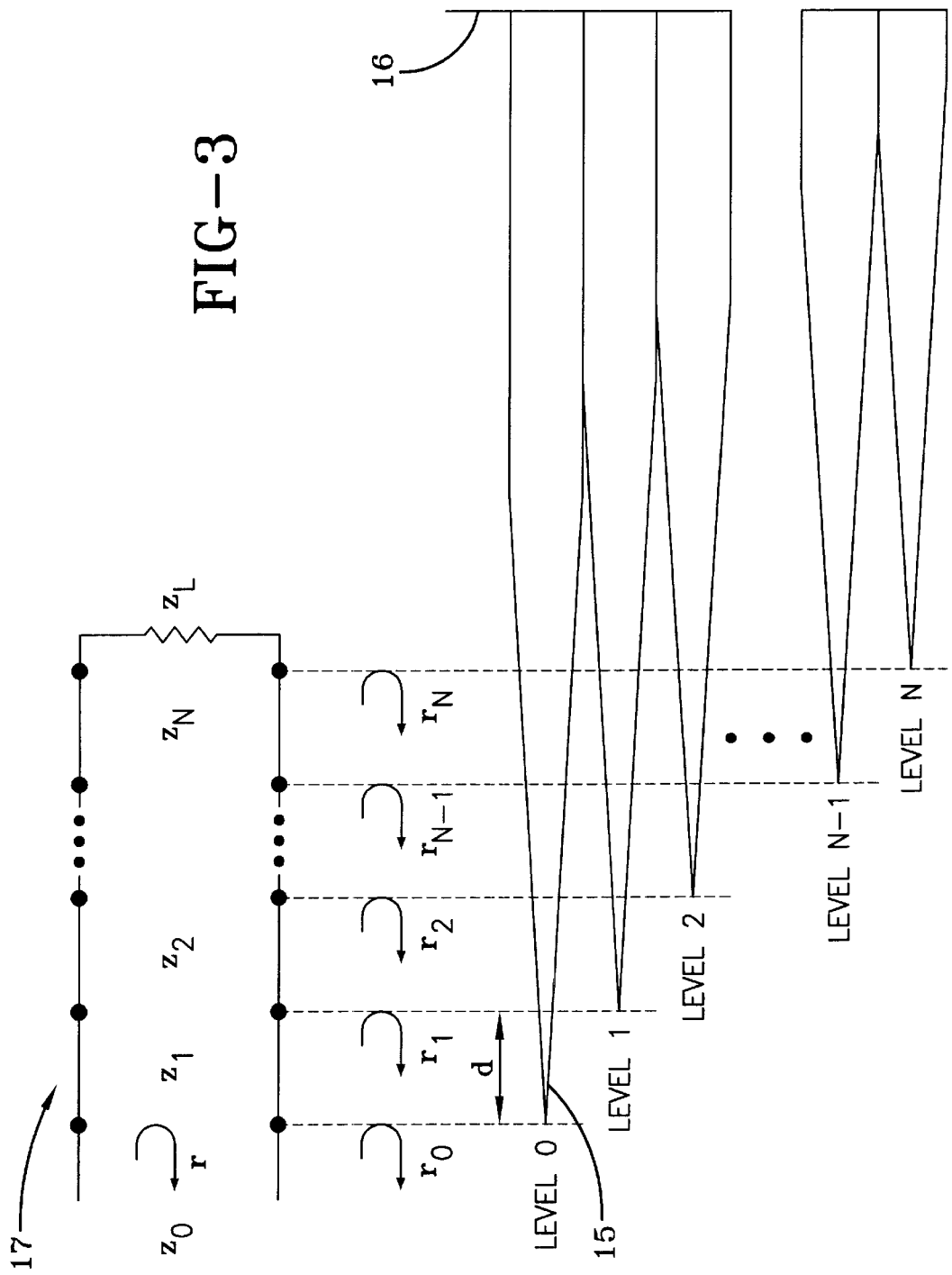
FIG. 3 is a side view of a pyramidal or wedge absorber layout of the present invention.

One way to address this problem is to develop a wedge absorber that scatters very little energy when illuminated from the broadside direction, especially for lower frequencies. A preferred embodiment of the present invention utilizes a type of absorber that has never been applied to a tapered chamber, called a Chebyshev absorber layout. As shown in FIG. 3, the concept is to place the wedge absorber tips 15 at different heights relative to the mounting wall 16. In this pattern, a wave reflects off the wedge tips and valleys, behaving very much like a reflection in a multi-section transmission line 17. If this pattern is chosen to match a Chebyshev layout, one can reduce the broadside backscatter by 15 to 20 dB. Using this Chebyshev wedge absorber around the test zone therefore substantially eliminates the problems mentioned earlier. In fact, the test zone fields will be very clean of stray signals and the polarization will be dictated by the feed horn as desired originally in the tapered chamber design concept.

Figure 4:
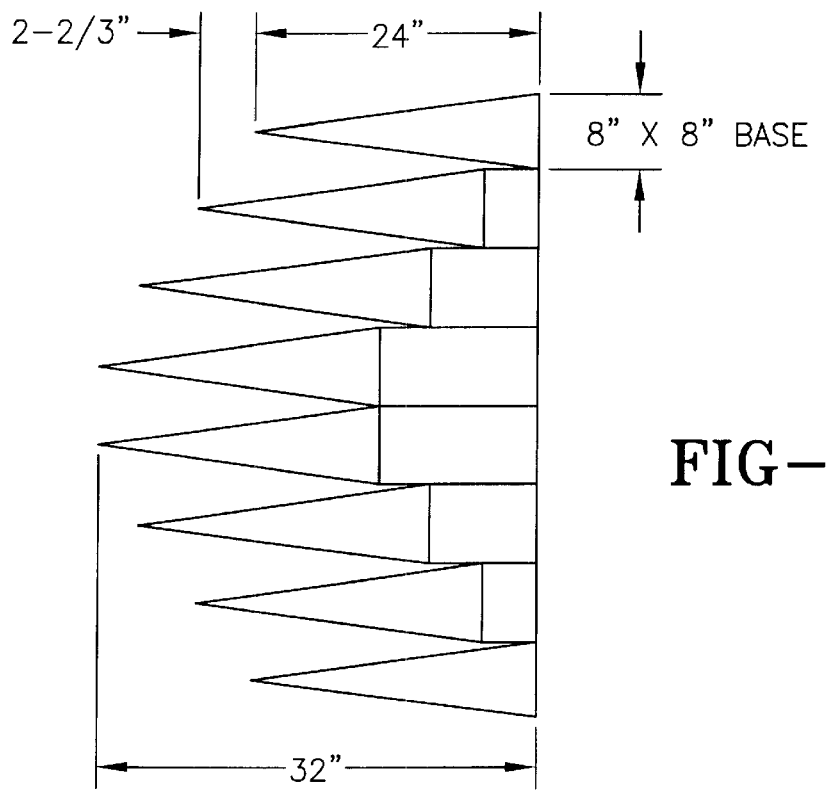
FIG. 4 is another side view of a pyramidal or wedge absorber layout of the present invention.

A preferred embodiment of the present invention also uses the Chebyshev layout on the back wall of the chamber. It is then not necessary to use very thick absorber for low frequency applications, which tend to deteriorate over time. For example, a prototype tapered chamber was constructed to operate from 400 MHz to 40 Ghz. This chamber was 28'×9'×9' and the back wall was covered with 24" thick standard pyramidal absorber in a Chebyshev layout. These pyramids were mounted at four different tiers chosen for 400 MHz: 0", 2⅔", 5⅓", and 8" from the back wall. Thus the tallest point from the back wall was 32". The placement of the different levels follows a pattern as shown in FIG. 4. As a reference, standard pyramids for 400 MHz are 72" thick, so the Chebyshev layout generally reduces the volume taken up by the back wall absorber.

Figure 6:
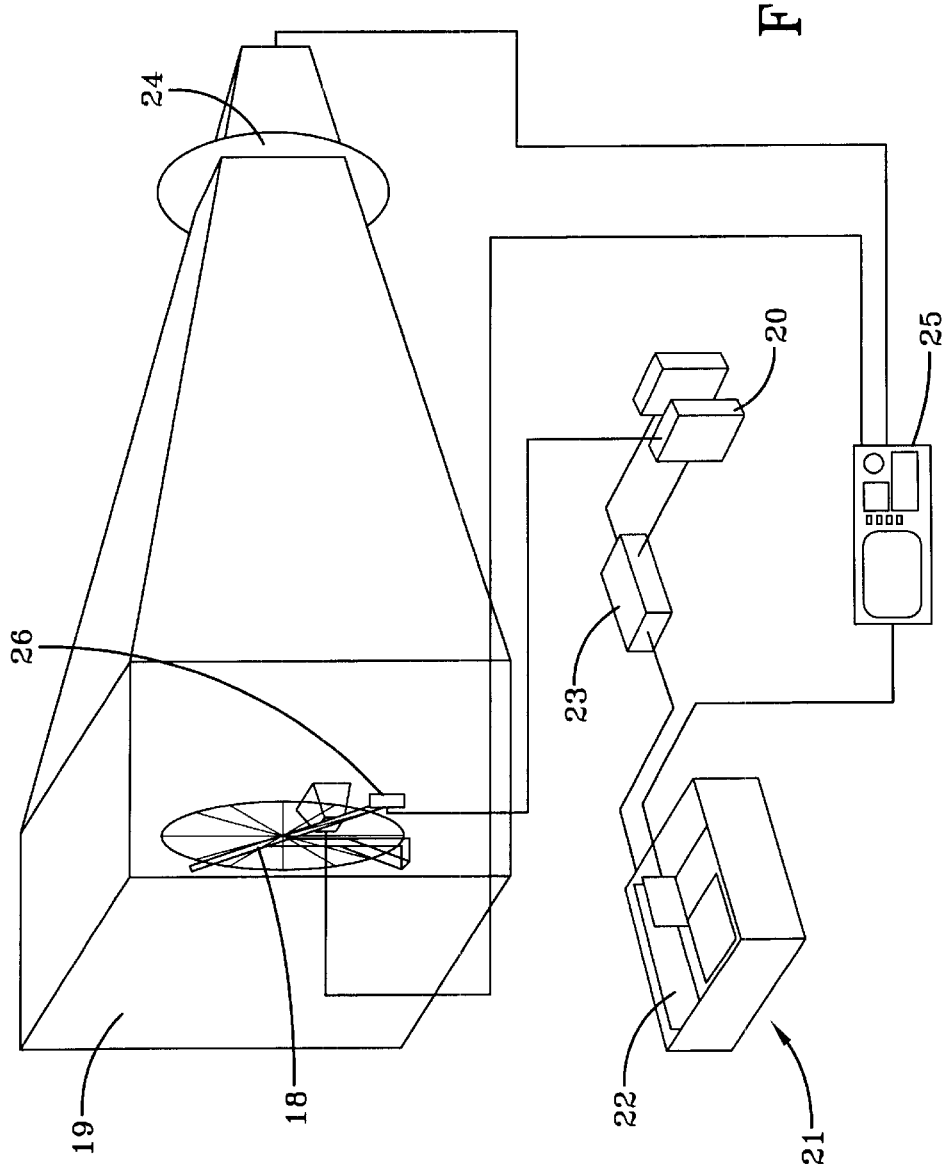
FIG. 6 is a schematic of a tapered chamber system of the present invention.

A complete prototype tapered chamber, shown in FIG. 5, was constructed to fully evaluate these enhancements. In order to verify the performance of this facility, it was field-probed as illustrated in FIG. 6. Note that the probe 18 was mounted in the center of the test zone 19 and rotated about a roll axis to obtain the field quality across the full test zone. The probe antenna was linearly translated by a stepper motor 26 and associated stepper drivers 20, controlled via computer 21 through a controller card 22 and indexer 23. The feed antenna 24 and probe antenna 18 were then monitored by a network analyzer 25, which can communicate back and forth with the computer 21.

Figure 7:
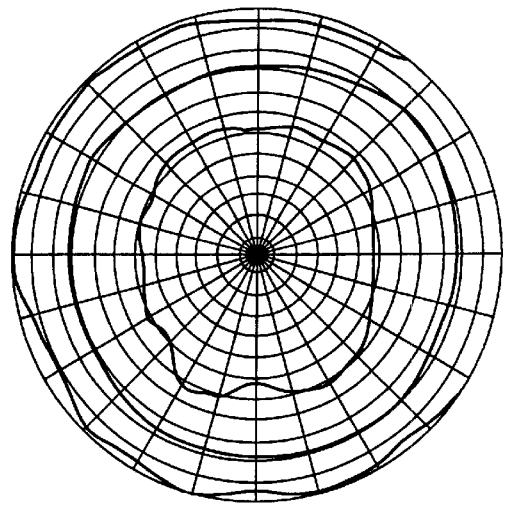
FIG. 7 is a plot of results obtained with a tapered chamber system of the present invention.
Figure 8:
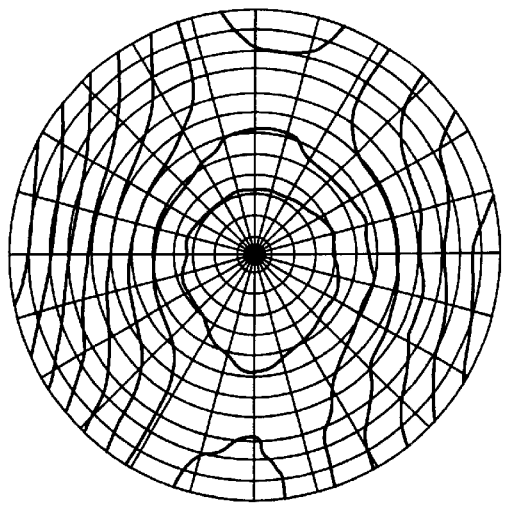
FIG. 8 is a plot of results obtained with a tapered chamber system of the present invention.
Figure 9:
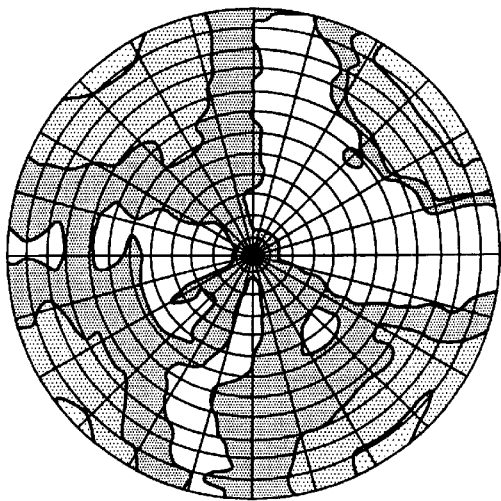
FIG. 9 is a plot of results obtained with a tapered chamber system of the present invention.

Some examples of co-polarized results are shown in FIGS. 7 and 8, and a cross-polarized example is shown in FIG. 9. One should note that the co-polarized test zone site, which was bounded by a 1 dB taper, decreases with frequency. In fact, the test zone defined by the 1 dB was very close in size to the usual 22 ½° phase variation limits. The cross-pol levels of FIG. 9 were measured to be −35 dB to −40 dB relative to the co-polarized result in the test zone, meaning that the cross-polarization is in fact very low. This all leads to the conclusion that this prototype measurement facility is functioning extremely well. In conclusion, this data validates the enhancements presented in the present invention.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, it will be within the ability of one of ordinary skill in the art to make alterations or modifications to the present invention, such as through the substitution of equivalent materials or structural arrangements, or through the use of equivalent process steps, so as to be able to practice the present invention without departing from its spirit as reflected in the appended claims, the text and teaching of which are hereby incorporated by reference herein. It is the intention, therefore, to limit the invention only as indicated by the scope of the claims and equivalents thereof.

REFERENCES

1. W. H. Emerson, "Anechoic Chamber," U.S. Pat. No. 3,308,463, Mar. 7, 1967.
2. W. D. Burnside, L-C. T. Chang, M. Gilreath, and B. Smith, "An Ultrawide Bandwidth Tapered Chamber Feed," 1996 AMTA Symposium, Seattle, Wash., October 1996.
3. A. K. Y. Lai, A. R. Sinpoli, and W. D. Burnside, "A Novel Antenna for Ultra-wide-band Applications," *IEEE Trans. Antennas Propagat.*, Vol. 40, No. 7, July 1992.

4. J-R. J. Gau, W. D. Burnside, and M. C. Gilreath, "Chebyshev Multilevel Absorber Design Concept," *IEEE Trans. Antennas Propagat.*, Vol. 45, No. 8, August 1997.

The above references are hereby incorporated herein.

What is claimed is:

Chebyshev Layout

1. A tapered anechoic chamber, said tapered anechoic chamber comprising:

a planar back wall, said planar back wall comprising a rectangular shape;

a planar front wall comprising a rectangular shape, said planar front wall parallel to and separated a distance from said back wall, said planar front wall comprising smaller dimension than said planar back wall, the center points of said planar back wall and said planar front wall lying along a line orthogonal to the planes defined by said planar front and back walls;

four side walls, each of said side walls connected to a full edge of said planar back wall, said side walls lying in planes orthogonal to the plane defined by said planar back wall, said four side walls connected so as to form a rectangular enclosure attached to said planar back wall;

four tapered side walls, each of said tapered side walls contacting a full outer edge of one of said side walls and a full edge of said planar front wall, said tapered side walls connected so as to form an enclosed range between said planar front wall and said planar back wall; and electromagnetic energy absorbing material attached to the inside of said enclosed range, said electromagnetic energy-absorbing material comprising a plurality of tapered members extending into said enclosed range and on at least one of said side walls or tapered side walls, at least one portion of said electromagnetic energy absorbing material comprising a plurality of tapered members wherein adjacent said tapered members comprise different lengths from the tip to the base of each said tapered member.

2. A tapered anechoic chamber according to claim 1 wherein said tapered members are selected from the group consisting of pyramidal members and wedge members.

3. A tapered anechoic chamber according to claim 1 wherein the tips of said plurality of tapered members form a periodic pattern.

4. A tapered anechoic chamber according to claim 3 wherein said periodic pattern is selected from the group consisting of sinusoidal patterns, semi-sinusoidal patterns, and Chebyshev patterns.

5. A tapered anechoic chamber according to claim 1 wherein said at least one portion of said electromagnetic energy absorbing material comprises the inner surfaces of said four side walls.

6. A tapered anechoic chamber according to claim 1 wherein said at least one portion of said electromagnetic energy absorbing material comprises the inner surfaces of said four tapered side walls.

7. A tapered anechoic chamber according to claim 1 wherein said at least one portion of said electromagnetic energy absorbing material comprises the inner surface of said planar back wall.

8. A tapered anechoic chamber according to claim 1 wherein said at least one portion of said electromagnetic energy absorbing material comprises the inner surface of said planar front wall.

9. A tapered anechoic chamber according to claim 1 additionally comprising a feed antenna positioned near said planar front wall in said enclosed range.

10. A tapered anechoic chamber according to claim 1 additionally comprising a probe antenna positioned between said four side walls in said enclosed range.

R-card

11. A tapered anechoic chamber, said tapered anechoic chamber comprising:

(a) a planar back wall, said planar back wall comprising a rectangular shape;

(b) a planar front wall comprising a rectangular shape, said planar front wall parallel to and separated a distance from said back wall, said planar front wall comprising smaller dimension than said planar back wall, the center points of said planar back wall and said planar front wall lying along a line orthogonal to the planes defined by said planar front and back walls;

(c) four side walls, each of said side walls connected to a full edge of said planar back wall, said side walls lying in planes orthogonal to the plane defined by said planar back wall, said four side walls connected so as to form a rectangular enclosure attached to said.planar back wall;

(d) four tapered side walls, each of said tapered side walls contacting a full outer edge of one of said side walls and a full edge of said planar front wall, said tapered side walls connected so as to form an enclosed range between said planar front wall and said planar back wall;

(e) electromagnetic energy absorbing material attached to the inside of said enclosed range;

(f) a TEM antenna extending into said enclosed range from said planar front wall; and (g) a resistive card terminating said TEM antenna in said enclosed range.

12. A tapered anechoic chamber according to claim 11 additionally comprising a probe antenna positioned between said four side walls in said enclosed range.

Rotating Tip Chamber

13. A tapered anechoic chamber, said tapered anechoic chamber comprising:

(a) a planar back wall, said planar back wall comprising a rectangular shape;

(b) a planar front wall comprising a rectangular shape, said planar front wall parallel to and separated a distance from said back wall, said planar front wall comprising smaller dimension than said planar back wall, the center points of said planar back wall and said planar front wall lying along a line orthogonal to the planes defined by said planar front and back walls;

(c) four side walls, each of said side walls connected to a full edge of said planar back wall, said side walls lying in planes orthogonal to the plane defined by said planar back wall, said four side walls connected so as to form a rectangular enclosure attached to said planar back wall;

(d) four tapered planar rear side portions, each of said tapered planar rear side portions contacting a full outer edge of one of said side walls, each of said tapered rear side portions lying in a plane defined by an outer edge of one of said side walls and an edge of said planar front wall, said tapered planar rear side portions connected so as to define an open ended range;

(e) four tapered planar front side portions, each of said tapered planar front side portions contacting a full edge of said planar front wall, each of said tapered front side portions lying in a plane defined by an outer edge of one of said side walls and an edge of said planar front wall, said tapered planar front side portions connected so as to define an open ended tip separated from said open ended range;

(f) electromagnetic energy absorbing material attached to the inside of said open ended range and said open ended tip; and (g) a system of rollers positioned between said open ended range and said open ended tip, said system of rollers adapted to allow rotation of said open ended tip relative to said open ended range.

14. A tapered anechoic chamber according to claim 13 additionally comprising a feed antenna positioned between said tapered planar front side portions.

15. A tapered anechoic chamber according to claim 13 additionally comprising a probe antenna positioned between said four side walls.

Complete Chamber

16. A tapered anechoic chamber, said tapered anechoic chamber comprising:

(a) a planar back wall, said planar back wall comprising a rectangular shape;

(b) a planar front wall comprising a rectangular shape, said planar front wall parallel to and separated a distance from said back wall, said planar front wall comprising smaller dimension than said planar back wall, the center points of said planar back wall and said planar front wall lying along a line orthogonal to the planes defined by said planar front and back walls;

(c) four side walls, each of said side walls connected to a full edge of said planar back wall, said side walls lying in planes orthogonal to the plane defined by said planar back wall, said four side walls connected so as to form a rectangular enclosure attached to said planar back wall;

(d) four tapered planar rear side portions, each of said tapered planar rear side portions contacting a full outer edge of one of said side walls, each of said tapered rear side portions lying in a plane defined by an outer edge of one of said side walls and an edge of said planar front wall, said tapered planar rear side portions connected so as to define an open ended range;

(e) four tapered planar front side portions, each of said tapered planar front side portions contacting a full edge of said planar front wall, each of said tapered front side portions lying in a plane defined by an outer edge of one of said side walls and an edge of said planar front wall, said tapered planar front side portions connected so as to define an open ended tip separated from said open ended range;

(f) electromagnetic energy absorbing material attached to the inside of said open ended range and said open ended tip, said electromagnetic energy-absorbing material comprising a plurality of tapered members extending into said open ended range and said open ended tip, at least one portion of said electromagnetic energy-absorbing material comprising a plurality of tapered members wherein adjacent said tapered members comprise different lengths from the tip to the base of each said tapered member;

(g) a system of rollers positioned between said open ended range and said open ended tip, said system of rollers adapted to allow rotation of said open ended tip relative to said open ended range;

(h) a TEM antenna extending into said open ended tip from said planar front wall; and (i) a resistive card terminating said TEM antenna in said open ended tip.

17. A tapered anechoic chamber according to claim 16 additionally comprising a probe antenna positioned between said four side walls.

18. A tapered anechoic chamber according to claim 16 wherein said tapered members are selected from the group consisting of pyramidal members and wedge members.

19. A tapered anechoic chamber according to claim 16 wherein the tips of said plurality of tapered members form a periodic pattern.

20. A tapered anechoic chamber according to claim 19 wherein said periodic pattern is selected from the group consisting of sinusoidal patterns, semi-sinusoidal patterns, and Chebyshev patterns.

21. A tapered anechoic chamber, said tapered anechoic chamber comprising:

a planar back wall, said planar back wall comprising a rectangular shape;

a planar front wall comprising a rectangular shape, said planar front wall parallel to and separated a distance from said back wall, said planar front wall comprising smaller dimension than said planar back wall, the center points of said planar back wall and said planar front wall lying along a line orthogonal to the planes defined by said planar front and back walls;

four tapered side walls, each of said tapered side walls contacting a full outer edge of one of said side walls and a full edge of said planar front wall, said tapered side walls connected so as to form an enclosed range between said planar front wall and said planar back wall; and electromagnetic energy absorbing material attached to the inside of said enclosed range, said electromagnetic energy-absorbing material comprising a plurality of tapered members extending into said enclosed range on at least one of said tapered side walls, at least one portion of said electromagnetic energy absorbing material comprising a plurality of tapered members wherein adjacent said tapered members comprise different lengths from the tip to the base of each said tapered member.

* * * * *